(12) United States Patent
Tatum

(10) Patent No.: US 7,778,551 B2
(45) Date of Patent: Aug. 17, 2010

(54) TEMPERATURE COMPENSATION CIRCUITS

(75) Inventor: Jimmy Tatum, Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 1115 days.

(21) Appl. No.: 11/118,977

(22) Filed: Apr. 29, 2005

(65) Prior Publication Data

US 2006/0262822 A1    Nov. 23, 2006

(51) Int. Cl.
*H04B 10/04* (2006.01)
(52) U.S. Cl. .................. 398/182; 398/192; 398/197; 372/38.02; 372/38.07
(58) Field of Classification Search ............... 398/182, 398/192, 197, 196, 183; 372/34, 33, 38.02, 372/38.07
See application file for complete search history.

(56) References Cited

U.S. PATENT DOCUMENTS

| | | | | |
|---|---|---|---|---|
| 3,630,084 A | * | 12/1971 | McBride et al. | 374/109 |
| 5,761,230 A | * | 6/1998 | Oono et al. | 372/38.01 |
| 5,907,569 A | * | 5/1999 | Glance et al. | 372/29.021 |
| 6,559,997 B1 | * | 5/2003 | Tokita et al. | 398/197 |
| 2004/0114650 A1 | * | 6/2004 | Tanaka et al. | 372/38.02 |
| 2006/0045437 A1 | | 3/2006 | Tatum et al. | |

FOREIGN PATENT DOCUMENTS

JP    56-26482    * 3/1981

* cited by examiner

*Primary Examiner*—M. R. Sedighian
(74) *Attorney, Agent, or Firm*—Workman Nydegger

(57) ABSTRACT

A differential driver configured to drive an optical source. The differential driver includes an anode transistor configured to connect to a diode anode. The differential driver further includes a cathode transistor configured to connect to a diode cathode. The differential driver additionally includes a tail current transistor. The tail current transistor controls the amount of modulation current through a diode. The tail current transistor includes provisions that control the current through the tail current transistor for controlling the amount of modulation current through the diode. The provisions are dependant on a temperature in or at which the diode operates.

18 Claims, 2 Drawing Sheets

TEMPERATURE COMPENSATION CIRCUITS

BACKGROUND OF THE INVENTION

1. The Field of the Invention

The invention generally relates to driving optical components. More specifically, the invention relates to compensating driving signals of optical components to compensate for environmental or devices differences.

2. Description of the Related Art

Modern day computer networks allow for transmissions of large amounts of data between computer terminals. Data may be transmitted on a network across a number of different mediums. For example, data may be transmitted across traditional copper wire based cables. However, copper wire based cables are subject to limitations that are making them less attractive as a solution for many modern networks. Specifically, the copper wire based cables are limited in the amount of data they can carry in a given time period and the length that the data can travel. As computer technology continues to increase in the amount of data that can be produced in a given time period, other types of cable with higher capacities and longer transmission distances may be desirable.

One type of cable that is capable of higher data transmission rates over longer distances is fiber-optic cable. Fiber-optic cables are plastic or stretched glass cables that carry data signals in the form of light. Light signals can propagate on fiber-optic cables at higher speeds and for longer distances than electronic signals on copper wire based cables. Further, fiber-optic cables are potentially lighter weight and less expensive than their copper based counterparts. Thus, fiber-optic cables are steadily becoming a more popular choice for communication networks.

While fiber-optic data signal are optical or light signals, data signals at computer terminals generally continue to be electronic data signals. The electronic data signals being sent by a computer terminal are therefore converted using an electro-optical transducer, such as a laser diode or light emitting diode (LED) that converts the electronic data signals to corresponding optical data signals. To receive a signal from a fiber-optic network, a computer terminal converts the optical data signal to a corresponding electronic signal using an opto-electronic transducer, such as a photodiode and post-amplifier.

A laser diode emits laser light at varying power levels when a varying power level electronic signal is applied to anode and cathode terminals of the laser diode. Thus a modulated optical signal can be produced directly from a corresponding modulated electronic data signal using a laser diode. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on by being biased by a DC bias current, but varies from a high optical output to a lower optical output by being modulated by an AC modulation current.

There is often a need to control or monitor the actual power being output by a laser diode or LED. Digital optical signals are often required to be within a certain optical power level. The optical output of laser diodes for a given current through the laser diode is dependant on factors such as temperature. As the ambient temperature in which a laser diode operates increases, without intervention, bias and modulation currents will also increase. This will affect the optical power output. To maintain appropriate power levels, there is a need to compensate for temperature fluctuations.

BRIEF SUMMARY OF THE INVENTION

One embodiment includes a differential driver configured to drive an optical source. The differential driver includes an anode transistor configured to connect to a diode anode. The differential driver further includes a cathode transistor configured to connect to a diode cathode. The differential driver additionally includes a tail current transistor. The tail current transistor controls the amount of modulation current through a diode. The tail current transistor includes provisions that control the current through the tail current transistor for controlling the amount of modulation current through the diode. The provisions are dependant on a temperature in or at which the diode operates.

Another embodiment includes an optical transmitter. The optical transmitter includes an optical source. The optical source includes a diode including a cathode and an anode. A differential driver is connected to the optical source. The differential driver includes an anode connected transistor connected to the diode anode, a cathode connected transistor coupled to the diode cathode, and a tail current transistor that controls the amount of modulation current through the diode. The tail current transistor includes provisions that control the current through the tail current transistor for controlling the amount of modulation current through the diode.

Another embodiment includes an optical transmitter. The optical transmitter includes a means for generating optical energy. Such a means may be for example a VCSEL. The optical transmitter further includes means for driving the means for generating optical energy, such as a laser driver. The means for driving comprises a means for controlling an amount of modulation supplied to the means for generating optical energy, such as a tail current transistor and related circuitry. The means for generating optical energy generates an amount of optical energy proportional to the amount of modulation received by the means for generating optical energy.

Advantageously, the summarized embodiments allow for temperature regulation of a laser device to be accomplished. This allows a laser to output consistent optical signals across a temperature range.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Exemplary embodiments now described include a method of controlling laser output by controlling the tail current on a differential laser driver. The differential laser driver includes an anode connected transistor, a cathode connected transistor and a tail current transistor to control the aforementioned tail current. The tail current transistor includes provisions to control the tail current which can be varied to compensate for changes in operating temperature. The provisions may include, for example, a bond pad coupled to the tail current transistor that allows for an external signal that is dependent on temperature to control the amount of current through the tail current transistor. Alternatively, the provisions may include a temperature sensitive resistor with a fixed temperature coefficient being used to bias the tail current transistor. In yet another alternative embodiment, the provisions may include one or more temperature sensitive resistors with fixed temperature coefficients connected to the tail current transistor and each connected to a bond pad such that one or more temperature sensitive resistors may be selected depending on the characteristics of a laser connected to the differential laser driver.

The following embodiments may be used, for example, where a laser driver circuit and laser are packed together in a common package. For example, U.S. Provisional Patent Application No. 60/605,781 titled "Laser with Digital Electronic Interface," filed Aug. 31, 2004 and a subsequent utility patent application of the same title filed Mar. 17, 2004 claiming priority to the above provisional application, which are incorporated by reference herein in their entireties, describe a vertical cavity surface emitting laser (VCSEL) packaged together with a laser driver. In one embodiment, the VCSEL and laser driver are packaged together in a TO can package or other type package.

Figure 1:
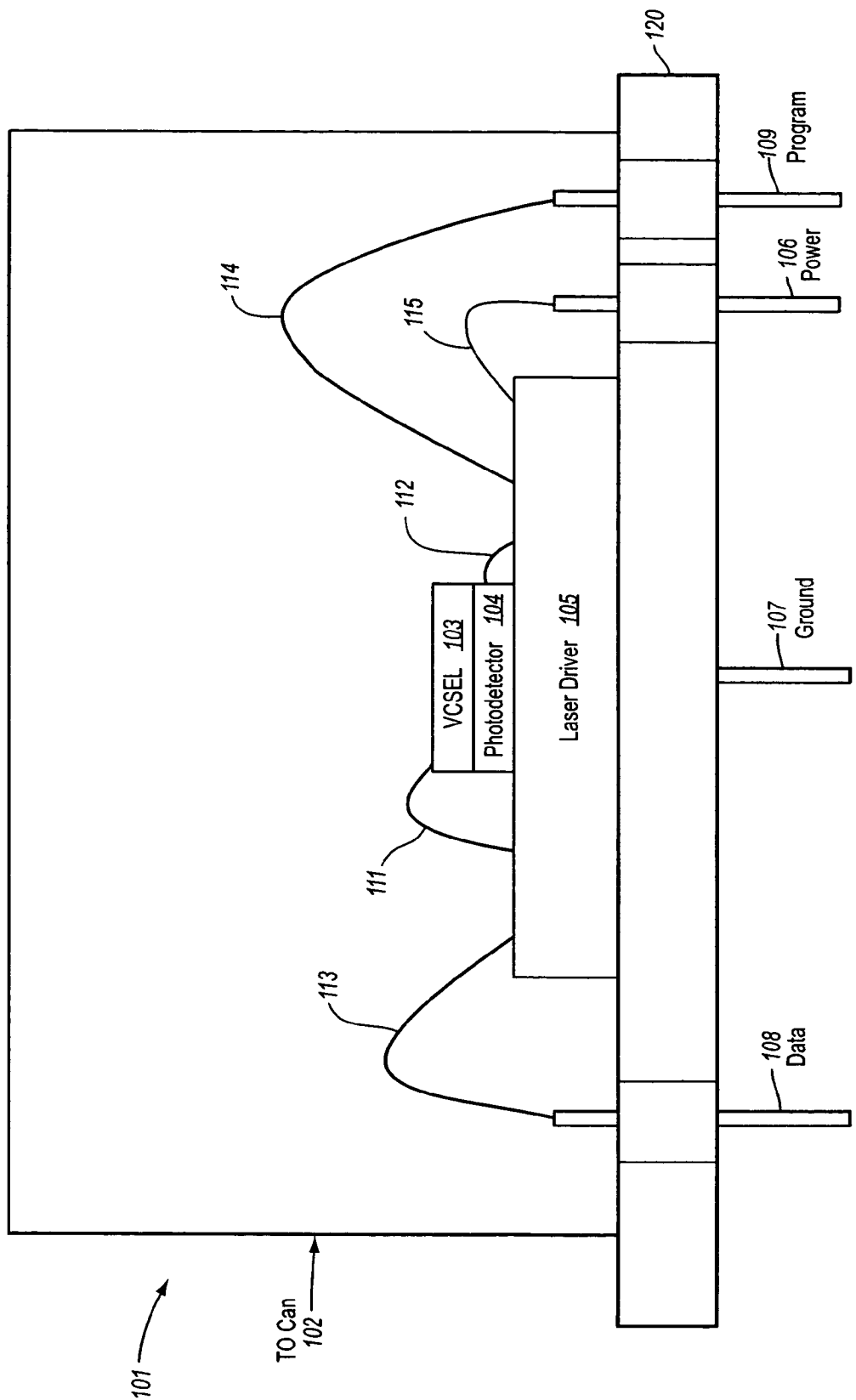
FIG. 1 illustrates a laser driver and laser packaged in a TO can.

For example, with reference to FIG. 1, an embodiment of an optical transmission component is illustrated. The optical transmission component 101 includes a header 120 with a laser driver 105, photodetector 104, and VCSEL 103 located above the header 120. The laser driver 105 may include internal biasing electrically coupled to the VCSEL 103 by connection 111 (e.g., a wire bond) for providing a drive current to the VCSEL 103 to transmit an optical signal. Optical transmission component 101 further comprises a photodetector 104 for monitoring the output of the VCSEL 103 and providing feedback related to the output of the VCSEL 103 to the laser driver 105 using connection 112.

The optical transmission component 101 may include a data connection 108, a ground connection 107, a power connection 106, and a program connection 109. Laser driver 105 is coupled (e.g., by wire bonds) to data connection 108, power connection 106, and program connection 109 by corresponding connections 113, 114, and 115 respectively. The program connection 109 may be a single wire serial connection or other interface. As depicted in FIG. 1, photodetector 104, and VCSEL 103 may be completely discrete components, or may be part of a common epitaxial design enclosed within a TO-can package 102 or other type of package. In some cases, electrical connections shown in the figures may not be required. For example, electrical connections other than wire bonds may be used, such as, for example, direct solder connections.

While the package shown illustrates a TO can 102 with pins 106-109, other embodiments may include other types of packaging and/or connections. For example, while pins are shown, a flex circuit may alternatively be used. The use of a flex circuit allows higher frequency signals, such as 10 Ghz and above, to be used. Further, the packaging may be an open cavity leadframe as opposed to the TO can package illustrated.

Various advantages can be realized by having the laser driver 105 in the same package with the VCSEL 103. For example, signal transitions occur faster, signals are less marginal, signals have less jitter, and better optical performance is achieved. In sum, fewer errors on data transmitted at higher rates are present in the signal as compared to previous signals.

Figure 2:
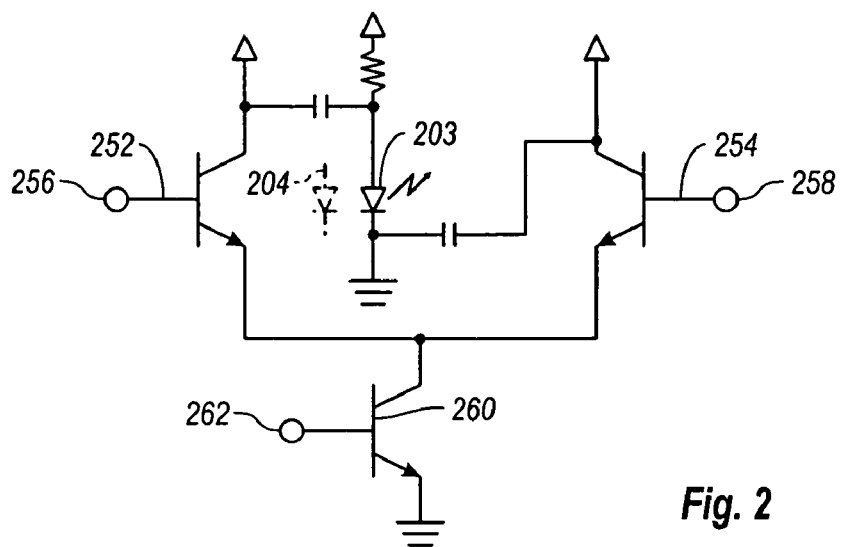
FIG. 2 illustrates a circuit diagram including a differential driver, VCSEL and associated bond pads.

Referring now to FIG. 2, one example of a temperature compensation method is illustrated. FIG. 2 illustrates a differential driver that may be included in a laser driver such as the laser driver 105 depicted in FIG. 1. The differential driver includes an anode connected transistor 252 and a cathode connected transistor 254. The anode connected transistor 252 is capacitively coupled to an anode bond pad 256. The cathode connected transistor 254 is capacitively coupled to a cathode bond pad 258. The anode bond pad 256 and the cathode bond pad 258 provide the differential connection for a modulated data signal to be input into the differential driver for modulating a VCSEL 203. By using a differential driver, an input signal into the differential connection can be used to create a cleaner signal to drive the VCSEL 203. The differential driver creates clearer transitions. The differential driver can be used to compensate for noise and jitter.

The differential driver also includes a tail current current source. The tail current current source includes a tail current transistor 260. The base of the tail current transistor 260 is connected to a current control bond pad 262. Temperature compensation may be performed by sensing temperature and compensating an input voltage at the current control bond pad 262 to compensate for temperature variations. In an alternative embodiment, temperature variations that result in variations of output optical power from the VCSEL 203 may be sensed by an optional photodetector 204. A control circuit coupled to the photodetector 204 and the current control pad 262 senses the change in output optical power and adjusts the voltage to the current control pad 262 accordingly. Embodiments that include the optional photodetector 204 may include a photodetector that is a discrete component packaged with the differential driver and VCSEL 203. Alternatively, the photodetector 204 may be formed epitaxially with the VCSEL 203. Examples of epitaxially formed VCSELs and photodiodes are described in U.S. patent application Ser. No. 10/871,274 filed Jun. 18, 2004 and Ser. No. 11/027,383 filed Dec. 30, 2004 which are incorporated herein by reference.

In the embodiment shown in FIG. 2, circuitry in a laser driver or elsewhere may be designed for a VCSEL with particular characteristics. Individual VCSELs have characteristics that exist as a result of anomalies occurring during fabrication of the VCSELs. The VCSELs can be tested to identify the particular characteristics of each of the VCSELs. The VCSELs can then be designated with a particular rating that will be known by individuals integrating the VCSELs into devices or components. The rating may be communicated through a designation on packaging or by some other prior arranged identification method. The circuitry in the laser driver or elsewhere may be such that by connecting bond pads, jumpers, or other electrical connections, the laser driver may be optimized for the particular rating of the VCSEL. The feedback algorithm that controls the VCSEL can be configured to include the rating of the VCSEL as a parameter that is compensated for so as to improve slope efficiency of a transmitter that includes the particular VCSEL.

Figure 3:
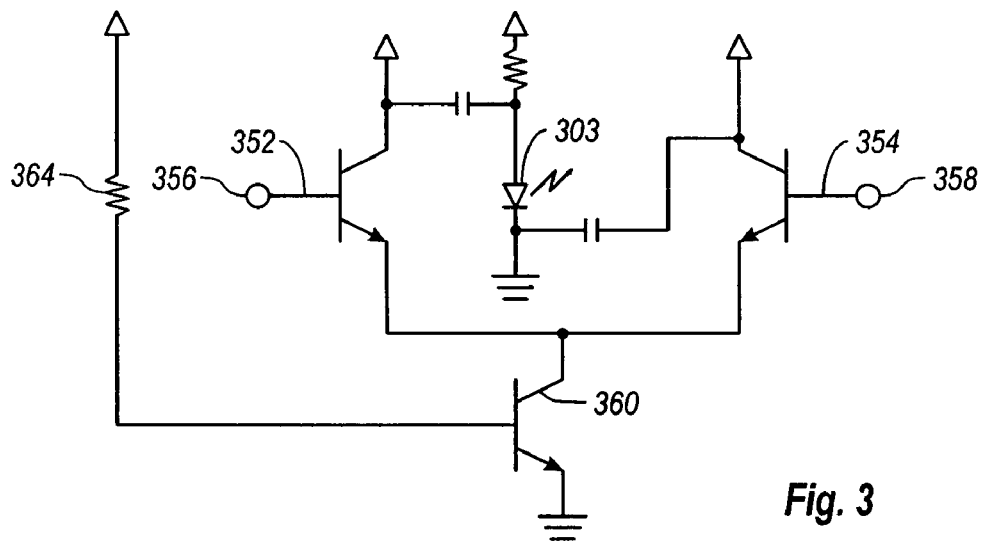
FIG. 3 illustrates a circuit diagram including a differential driver, VCSEL a temperature compensating resistor and associated bond pads.

Referring now to FIG. 3, an alternate method of compensating for temperature variations by controlling the tail current is illustrated. Similar to FIG. 2, the circuit shown in FIG. 3 illustrates a differential driver that may be included in a laser driver. The differential driver includes an anode connected transistor 352 and a cathode connected transistor 354. The anode connected transistor 352 is connected to an anode bond pad 356. The cathode connected transistor 354 is connected to a cathode bond pad 358. The anode bond pad 356 and the cathode bond pad 358 provide the differential connection for a modulated data signal to be input into the differential driver for modulating the VCSEL 303.

The differential driver also includes a tail current transistor 360. The base of the tail current transistor 360 is connected to a power supply through a temperature compensating resistor 364 to bias the tail current transistor 360. The temperature compensating resistor 364 includes a fixed temperature coefficient and is a temperature tunable resistor. The fixed temperature coefficient is designed to exhibit different resistance characteristics that are sensitive to the temperature of the temperature compensating resistor 364. The different resistance characteristics result in different bias voltages being present at the base of the tail current transistor.

As discussed previously herein, the voltage at the base of the tail current transistor 360 controls the amount of current that flows through the tail current transistor 360. The amount of current that flows through the tail current transistor 360 controls the amount of modulation that occurs at the VCSEL 303 as a result of a modulated signal being applied at the AC modulation bond pads 354, 356. In this fashion, the temperature compensating resistor's 364 temperature sensitivities can be used to vary the amount of modulation according to varying temperatures in which the VCSEL 303 operates. Thus, slope efficiency of a transmitter including the VCSEL 303 can be compensated over temperature.

Figure 4:
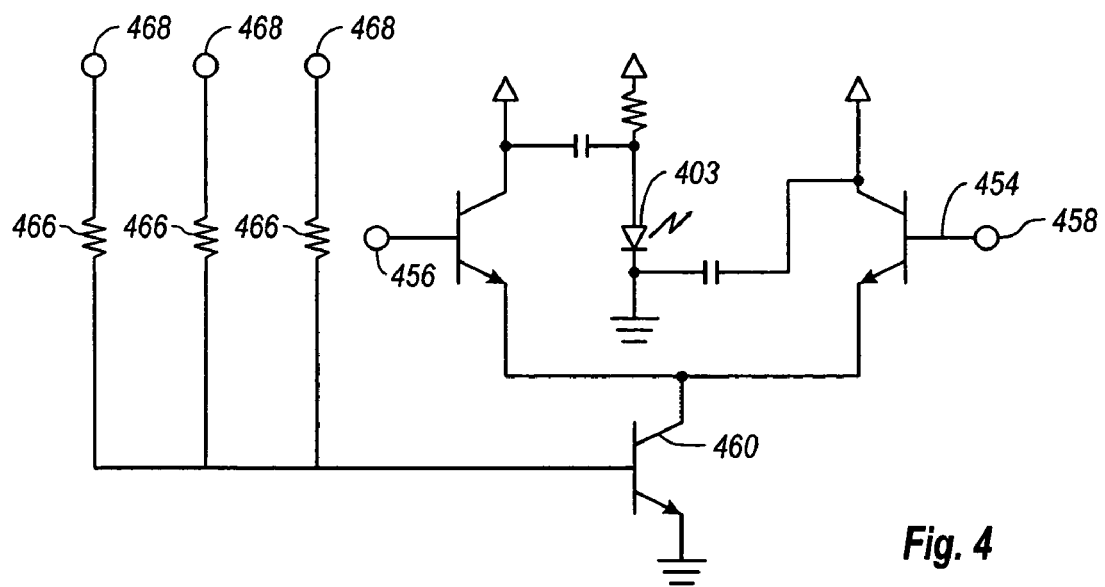
FIG. 4 illustrates a circuit diagram including a differential driver, VCSEL a number of temperature compensating resistors and associated bond pads.

Referring now to FIG. 4, an alternate method of compensating for temperature variations by controlling the tail current is illustrated. Similar to FIG. 2, the circuit shown in FIG. 4 illustrates a differential driver that may be included in a laser driver. The differential driver includes an anode connected transistor 452 and a cathode connected transistor 454. The anode connected transistor 452 is connected to an anode bond pad 456. The cathode connected transistor 454 is connected to a cathode bond pad 458. The anode bond pad 456 and the cathode bond pad 458 provide the differential connection for a modulated data signal to be input into the differential driver for modulating the VCSEL 403.

The differential driver also includes a tail current transistor 460. The base of the tail current transistor 460 is connected to a number of temperature compensating resistors 466. Similar to the temperature compensating resistor 364 in FIG. 3, the temperature compensating resistors 466 include fixed temperature coefficients. By including a number of different temperature compensating resistors 466, the circuit illustrated in FIG. 4 can be better optimized for to match a particular VCSEL 403 with particular ratings used in the circuit. As described above, laser components may be separated into categories of ratings depending on their operational characteristics. Better performance can be elicited from the laser components when the laser components are implemented in a circuit where other circuit components have been selected to more closely match the characteristics of the laser components.

As shown in FIG. 4, three different temperature compensating resistors 466 are included and connected to bond pads 468. One or more of the bond pads 468 can be connected to a biasing power supply to bias the tail current transistor 460. Seven different connection combinations exist for the temperature compensating resistors and thus, the circuit shown can be optimized for seven differently rated VCSELs 403. More or less resistors and bond pads can be provided to allow for more or less rating matching options.

Notably, while the embodiments shown herein have been shown using a TO-can package, other packages may be used as well. For example, in one embodiment, an open cavity leadframe may comprise a portion of the package. In this example, the leadframe is overmolded. One or more chips including the laser driver, VCSEL and any other circuitry can be mounted inside of the overmolded leadframe. An open cavity leadframe may be advantageous because it allows for higher speeds of data to be used, there is more area on which to arrange components in the package, and there is a potential for more inputs and outputs from the package.

Embodiments described herein may be recited as having certain functional means. For example, embodiments may include means for generating optical energy. A means for generating optical energy may include, for example, laser diodes, photodiodes, and the like. Embodiments may be described as including means for driving the means for generating optical energy. A means for driving the means for generating optical energy may include, for example, a laser driver such as the differential laser driver described herein or any other appropriate device The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A differential driver configured to drive an optical source, the differential driver comprising:
    an anode transistor configured to capacitively couple to a diode anode;
    a cathode transistor configured to capacitively couple to a diode cathode; and
    a tail current transistor that controls the amount of modulation current through a diode;
    a plurality of temperature compensating resistors adapted to control current through the tail current transistor, one or more of the temperature compensating resistors being selected for connection to the tail current transistor in dependence on a characteristics rating of the optical source.

2. A differential driver configured to drive an optical source, the differential driver comprising:
    an anode transistor configured to couple to a diode anode;
    a cathode transistor configured to couple to a diode cathode; and
    a tail current transistor that controls the amount of modulation current through a diode, the tail current transistor comprising provisions that control the current through the tail current transistor for controlling the amount of modulation current through the diode, wherein the provisions are dependent on a temperature in or at which the diode operates, wherein the provisions that control the current through the tail current transistor comprise a plurality of temperature compensating resistors connected in parallel and each including a fixed temperature coefficient, a first end of each of the temperature compensating resistors being directly coupled to the tail current transistor.

3. The differential driver of claim 2, wherein a second end of each of the temperature compensating resistors is directly coupled to a bond pad that allows the temperature compensating resistors to be connected to a biasing power supply.

4. The differential driver as recited in claim 2, wherein the temperature compensating resistors are temperature tunable.

5. An optical transmitter comprising:
an optical source comprising a diode having a cathode and an anode; and
a differential driver coupled to the optical source, the differential driver comprising:
an anode connected transistor capacitively coupled to the diode anode;
a cathode connected transistor capacitively coupled to the diode cathode; and
a tail current transistor that controls the amount of modulation current through the diode;
a plurality of temperature compensating resistors adapted to control current through the tail current transistor, one or more of the temperature compensating resistors being selected for connection to the tail current transistor in dependence on a characteristics rating of the optical source.

6. The optical transmitter of claim 5, wherein the optical transmitter is packaged in a TO can.

7. The optical transmitter of claim 5, wherein the optical transmitter is packaged in an overmolded leadframe.

8. The optical transmitter of claim 5, further comprising a photodetector optically coupled to the optical source.

9. The optical transmitter of claim 8, wherein the photodetector is a discrete component.

10. The optical transmitter of claim 8, wherein the photodetector is formed epitaxially with the optical source.

11. An optical transmitter comprising:
an optical source comprising a diode having a cathode and an anode; and
a differential driver coupled to the optical source, the differential driver comprising:
an anode connected transistor coupled to the diode anode;
a cathode connected transistor coupled to the diode cathode; and
a tail current transistor that controls the amount of modulation current through the diode, the tail current transistor comprising provisions that control the current through the tail current transistor for controlling the amount of modulation current through the diode,
wherein the provisions that control the current through the tail current transistor comprise a plurality of temperature compensating resistors connected in parallel and each including a fixed temperature coefficient, a first end of each of the temperature compensating resistors being directly coupled to the tail current transistor.

12. The optical transmitter of claim 11, wherein a second end of each of the temperature compensating resistors is directly coupled to a bond pad that allows the temperature compensating resistors to be connected to a biasing power supply.

13. The optical transmitter of claim 11, wherein the optical transmitter is packaged in one of a TO can and an overmolded leadframe.

14. The optical transmitter of claim 11, further comprising a photodetector optically coupled to the optical source.

15. The optical transmitter of claim 14, wherein the photodetector is a discrete component.

16. The optical transmitter of claim 14, wherein the photodetector is formed epitaxially with the optical source.

17. The optical transmitter as recited in claim 11, wherein the temperature compensating resistors are temperature tunable.

18. The optical transmitter as recited in claim 11, wherein a select combination of the temperature compensating resistors are coupled to a biasing power supply, the combination being selected so as to substantially match characteristics of the optical source.

* * * * *